(12) United States Patent
Roy

(10) Patent No.: US 11,527,570 B2
(45) Date of Patent: Dec. 13, 2022

(54) CHARGE-COUPLED DEVICE

(71) Applicant: STMicroelectronics (Crolles 2) SAS, Crolles (FR)

(72) Inventor: Francois Roy, Seyssin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/199,779

(22) Filed: Mar. 12, 2021

(65) Prior Publication Data
US 2021/0305311 A1   Sep. 30, 2021

(30) Foreign Application Priority Data

Mar. 30, 2020 (FR) ...................................... 2003147

(51) Int. Cl.
*H01L 27/148* (2006.01)
*H04N 5/372* (2011.01)
*H01L 27/146* (2006.01)

(52) U.S. Cl.
CPC .. *H01L 27/14812* (2013.01); *H01L 27/14831* (2013.01); *H04N 5/37206* (2013.01); *H01L 27/1463* (2013.01); *H01L 27/1464* (2013.01)

(58) Field of Classification Search
CPC ......... H01L 27/14812; H01L 27/14831; H01L 27/1463; H01L 27/1464; H04N 5/37206; H04N 5/372; H04N 5/37213; H04N 5/3725

USPC ........ 348/249, 250, 282, 283, 311, 317, 324
See application file for complete search history.

(56) References Cited

U.S. PATENT DOCUMENTS

| | | | | |
|---|---|---|---|---|
| 4,878,102 A | * | 10/1989 | Bakker | H01L 27/148 377/61 |
| 5,055,900 A | * | 10/1991 | Fossum | H01L 27/14831 257/236 |
| 6,586,784 B1 | * | 7/2003 | Parks | H04N 5/361 257/221 |
| 8,937,341 B2 | | 1/2015 | Roy | |
| 2010/0327326 A1 | * | 12/2010 | Roy | H01L 27/14812 257/E27.15 |

OTHER PUBLICATIONS

INPI Search Report and Written Opinion for FR 2003147 dated Nov. 18, 2020 (9 pages).

* cited by examiner

*Primary Examiner* — Albert H Cutler
(74) *Attorney, Agent, or Firm* — Crowe & Dunlevy

(57) ABSTRACT

A charge-coupled device includes an array of insulated electrodes vertically penetrating into a semiconductor substrate. The array includes rows of alternated longitudinal and transverse electrodes. Each end of a longitudinal electrode of a row is opposite and separated from a portion of an adjacent transverse electrode of that row. Electric insulation walls extend parallel to one another and to the longitudinal electrodes. The insulation walls penetrate vertically into the substrate deeper than the longitudinal electrodes. At least two adjacent rows of electrodes are arranged between each two successive insulation walls.

22 Claims, 8 Drawing Sheets

CHARGE-COUPLED DEVICE

PRIORITY CLAIM

This application claims the priority benefit of French Application for Patent No. 2003147, filed on Mar. 30, 2020, the content of which is hereby incorporated by reference in its entirety to the maximum extent allowable by law.

TECHNICAL FIELD

The present disclosure relates to charge-coupled devices (CCDs) and, more particularly, aims at a two-phase charge-coupled device, that is, a device where a charge transfer is performed in two phases, also called two-phase transfer device. The present disclosure particularly aims at a light sensor, such as an image sensor, comprising such a device.

BACKGROUND

Charge-coupled devices comprising an array of insulated electrodes vertically penetrating into a semiconductor substrate are known. The properly-biased electrodes of the array define a plurality of potential wells in the substrate. When the substrate receives light, electron-hole pairs are photo-generated in the substrate and accumulate in potential wells defined between the electrodes. The charges accumulated in the potential wells are then transferred from one potential well to an adjacent potential well by modifying, in two phases, electrode biasings.

FIGS. 1 and 2 respectively correspond to the FIGS. 6A and 7 of U.S. Pat. No. 8,937,341 (incorporated by reference) and schematically show an example of an image sensor comprising a charge-coupled device provided with an array of insulated electrodes vertically penetrating into a semiconductor substrate. FIG. 1 is a top view of a portion of the image sensor and FIG. 2 is a perspective cross-section view schematically showing a portion of the sensor of FIG. 1.

A P-type doped silicon substrate 1 has an N-type doped layer 3 arranged thereon. Layer 3 and possibly the upper portion of substrate 1 form the sensor photoconversion area. A thin P-type doped layer 5 covers the surface of layer 3.

The photoconversion area is divided into a plurality of parallel lines 7, separated by rows 9 of insulated electrodes 11 extending vertically through layers 5, 3, and 1. Each electrode 11 is formed of a T-shaped groove, comprising a longitudinal bar 13 and a transverse bar 15, filled with doped polysilicon and insulated from the substrate by an oxide layer 17. Longitudinal bars 13 are aligned and oriented parallel to the charge transfer direction. Transverse bars 15 are orthogonal to longitudinal bars 13 and are arranged upstream of longitudinal bars 13 with respect to charge transfer direction 19. The electrodes 11 of two adjacent rows 9 are opposite two by two and form electrode columns 21. The opposite ends of two transverse bars 15 of two successive electrodes of a same column 21 are separated from each other by a space e1.

A pixel is defined by the region comprised between two successive electrodes 11 G11, G12 of a first row 9, and the two corresponding electrodes G11, G12 of a second row 9 adjacent to the first row.

All the electrodes of a same column 21 are interconnected and are set to a same potential. Electrodes 11, properly biased, define in each line 7 a succession of potential wells where electric charges may be stored.

During an image acquisition step, the upper surface of the sensor is illuminated and electrons, resulting from the creation, by absorption of a photon, of an electron-hole pair in the photoconversion area, are stored in the potential wells. Substrate 1 is connected, in operation, to a reference potential, the ground, enabling the holes resulting from the photoconversion to flow.

After the acquisition step, a transfer step is provided, during which the charges stored in the potential wells are transferred, in the direction of arrows 19. The charge transfer is ensured by successive switchings, between high and low states, in two phases, of control signals $\Phi 11$, $\Phi 12$ applied to respective electrodes G11, G12.

FIG. 3 is a copy of FIG. 9 of the above-mentioned U.S. Pat. No. 8,937,341 and schematically illustrates the storage, during an image acquisition step, of photogenerated electrons in potential wells formed by application of control signals $\Phi 11$, $\Phi 12$ to electrodes G11, G12 of the sensor described in relation with FIGS. 1 and 2. FIG. 3 further illustrates a transfer in two phases of the electrons, from one potential well to an adjacent potential well, by switching between high and low states of control signals $\Phi 11$ and $\Phi 12$.

At a time t0 corresponding to the end of an image acquisition step, control signal $\Phi 11$ is in the low state, for example, at a potential in the order of 0 V, control signal $\Phi 12$ is in the high state, for example, at a potential in the order of 5 V, and electrons, represented by the hatched areas of the drawing, are stored in potential wells.

In a column 21, when two opposite electrodes G11 or two opposite electrodes G12 are set to a same potential, the two opposite electrodes, and more particularly the longitudinal bars 13 of these opposite electrodes, define together a potential well where photogenerated electrons may be stored. The higher the potential applied to the two electrodes, the deeper the potential well defined by the two electrodes.

Further, when two opposite electrodes G11 or G12 are set to the same potential, a potential barrier is created in space e1 between the opposite ends of transverse bars 15 of the two electrodes.

When the two opposite electrodes G11 or G12 are at a same high potential, the potential barrier in the corresponding space e1 is low and conducts electrons, in transfer direction 19, from a shallower potential well to an adjacent deeper potential well of the same line 7. More particularly, when the opposite electrodes G11 and the opposite electrodes G12 respectively are in the low state (G11) and in the high state (G12), the potential in space e1 between electrodes G12 is at an intermediate level between the potential well defined by the low level applied to electrodes G11 and the potential well defined by the high level applied to electrodes G12 and thus conducts electrons, in transfer direction 19, in a same line 7, from the shallower potential well between electrodes G11 to the adjacent deeper potential well between electrodes G12.

When the two opposite electrodes G11 or G12 are at a same low potential, the potential barrier in the corresponding space e1 is high and opposes the electron flow in transfer direction 19.

Thus, at time t0, electron bunches corresponding to points of the acquired image are stored in the N layer, in the potential well defined between the electrodes G12 of each pixel.

At a time t0+T, T being the clock period driving the charge transfer, the control signals $\Phi 11$ and $\Phi 12$ applied to respective electrodes G11 and G12 are switched. This results in the shifting, in transfer direction 19, of the potential wells and of the potential barriers. This causes the synchronous shifting of the electron bunches, in transfer direction 19

(towards the right in the shown example). The position of transverse bars 15 relative to longitudinal bars 13 (on the left-hand side in the shown example) determines charge transfer direction 19 (towards the right in the shown example).

At a time t0+2T (not shown), in each line 7, the electrons stored in a pixel have been shifted to an adjacent pixel located on its right-hand side.

There is a need to improve at least certain aspects of known charge-coupled devices comprising an array of insulated vertical electrodes, and particularly of known light sensors comprising such charge-coupled devices, such as for example the sensor of U.S. Pat. No. 8,937,341.

SUMMARY

An embodiment overcomes all or part of the disadvantages of known charge-coupled devices.

An embodiment overcomes all or part of the disadvantages of light sensors, and in particular of image sensors, comprising known charge-coupled devices.

An embodiment provides a charge-coupled device comprising: an array of insulated electrodes vertically penetrating into a semiconductor substrate, the array comprising rows of alternated longitudinal and transverse electrodes, each end of a longitudinal electrode of a row being opposite and separated from a portion of an adjacent transverse electrode of said row; and electric insulation walls parallel to one another and to the longitudinal electrodes, the electric insulation walls penetrating vertically into the substrate deeper than the longitudinal electrodes, and at least two adjacent rows of electrodes being arranged between each two successive electric insulation walls.

According to an embodiment, the electrodes of the array form columns of longitudinal electrodes alternated with columns of transverse electrodes, said columns being orthogonal to the rows, preferably in each column of transverse electrodes, the transverse electrodes of the column are aligned and, in each column of longitudinal electrodes, the longitudinal electrodes of the column are parallel to one another.

According to an embodiment, between each two successive electric insulation walls, the electrodes of said at least two rows belonging to a same column are electrically coupled together.

According to an embodiment, two successive electric insulation walls laterally delimit pixels of a pixel row, preferably the device comprising a plurality of pixel rows.

According to an embodiment, two transverse electrode columns separated from each other by at least another column of transverse electrodes laterally delimit pixels of a same pixel column, preferably the device comprising a plurality of pixel columns.

According to an embodiment, the transverse electrodes laterally delimiting pixels penetrate into the substrate down to a same depth as said electric insulation walls.

According to an embodiment, the semiconductor substrate is doped with a first conductivity type and comprises, between each two successive electric insulation walls, a doped well of a second conductivity type penetrating less deeply into the semiconductor substrate than the longitudinal electrodes.

According to an embodiment, between each two successive electric insulation walls: the well extends widthwise at least from the longitudinal electrodes of said at least two rows which is the closest to a first one of the two successive electric insulation walls all the way to at least the longitudinal electrodes of that of said at least two rows which is closest to a second one of the two successive electric insulation walls; and the doped well of the second conductivity type extends lengthwise at least along the entire length of said at least two rows.

According to an embodiment, the semiconductor substrate comprises a doped layer of the first conductivity type covering each doped well of the second conductivity type, preferably said layer being more heavily doped with the first conductivity type than the semiconductor substrate, preferably said doped layer of the first conductivity type extending, between each two successive electric insulation walls, from one to the other of said two successive electric insulation walls and from one end to another of each of said two successive electric insulation walls.

According to an embodiment, said electric insulation walls are insulated conductive walls.

An embodiment provides a light sensor comprising the described device, and an interconnection structure resting on a front surface of the semiconductor substrate from which the electrodes and the electric insulation walls penetrate into the semiconductor substrate, the sensor being configured to receive light on the front surface side of the semiconductor substrate or on a back side of the semiconductor substrate opposite to the front surface.

An embodiment provides a method of two-phase charge transfer in the described device, wherein: during a charge transfer in a given direction, each longitudinal electrode of each row is electrically coupled to the adjacent transverse electrode in said row which is arranged upstream of said longitudinal electrode with respect to the transfer direction; and in a row of electrodes, a first shift signal is applied to one longitudinal electrode out of two, and a second shift signal is applied to the other longitudinal electrodes.

According to an embodiment: during a first one of the two phases of the transfer, the first signal is in a high state and the second signal is in a low state; and during the second one of the two transfer phases, the first signal is switched to the low state and the second signal is switched to the high state.

According to an embodiment: during a first one of the two phases of the transfer, the first and second signals are in the low state during a portion of the first phase, and the first signal is set to the high state during the other portion of the first phase; and during the second one of the two transfer phases, the first and second signals are in the low state during a portion of the second phase, and the second signal is set to the high state during the other portion of the second phase.

According to an embodiment, the signal received by each transverse electrode is phase leading over the signal received by the longitudinal electrode to which the transverse electrode is electrically coupled.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 4:
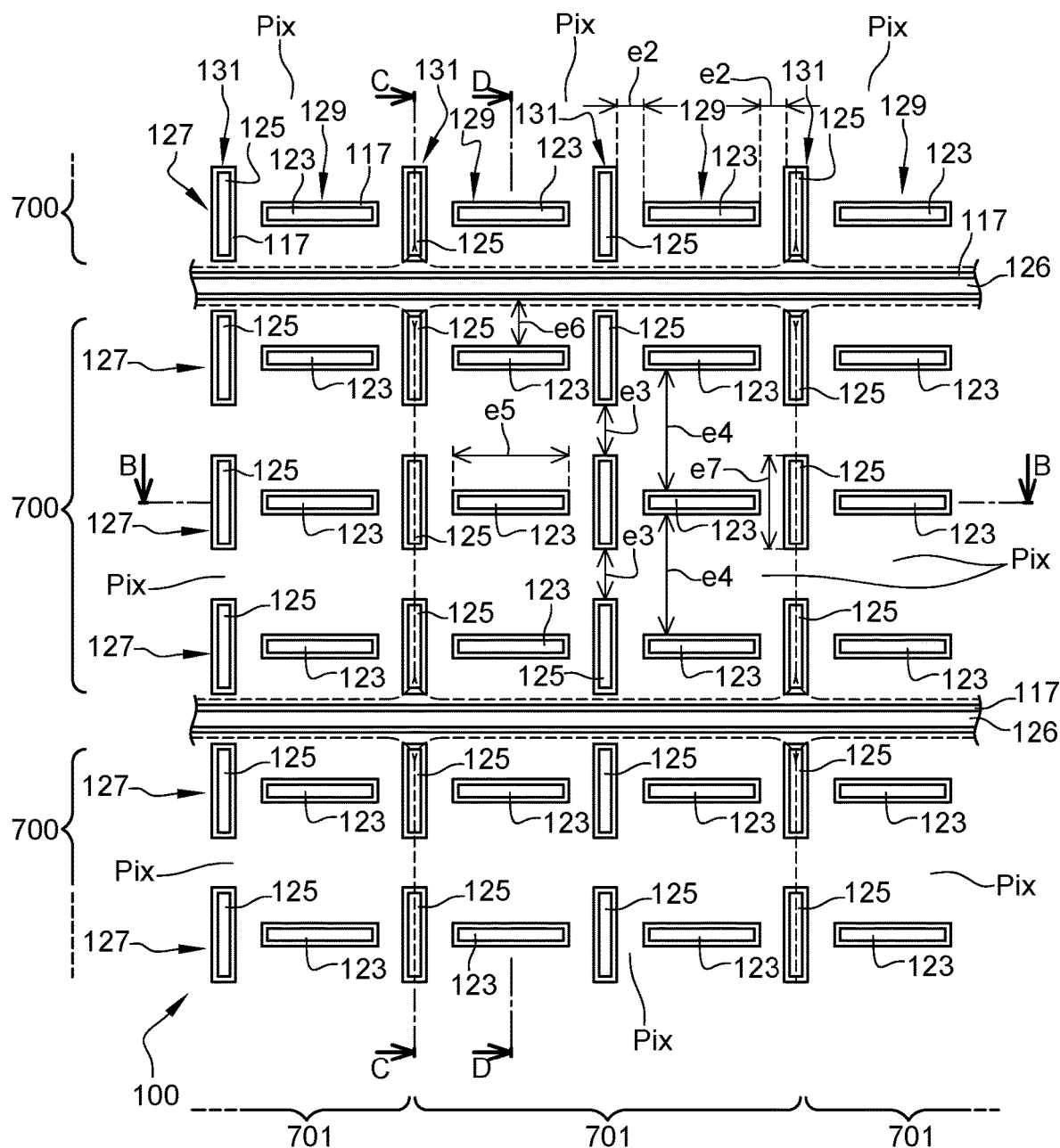
FIG. 4 is a top view schematically showing an embodiment of a charge-coupled device.
Figure 5:
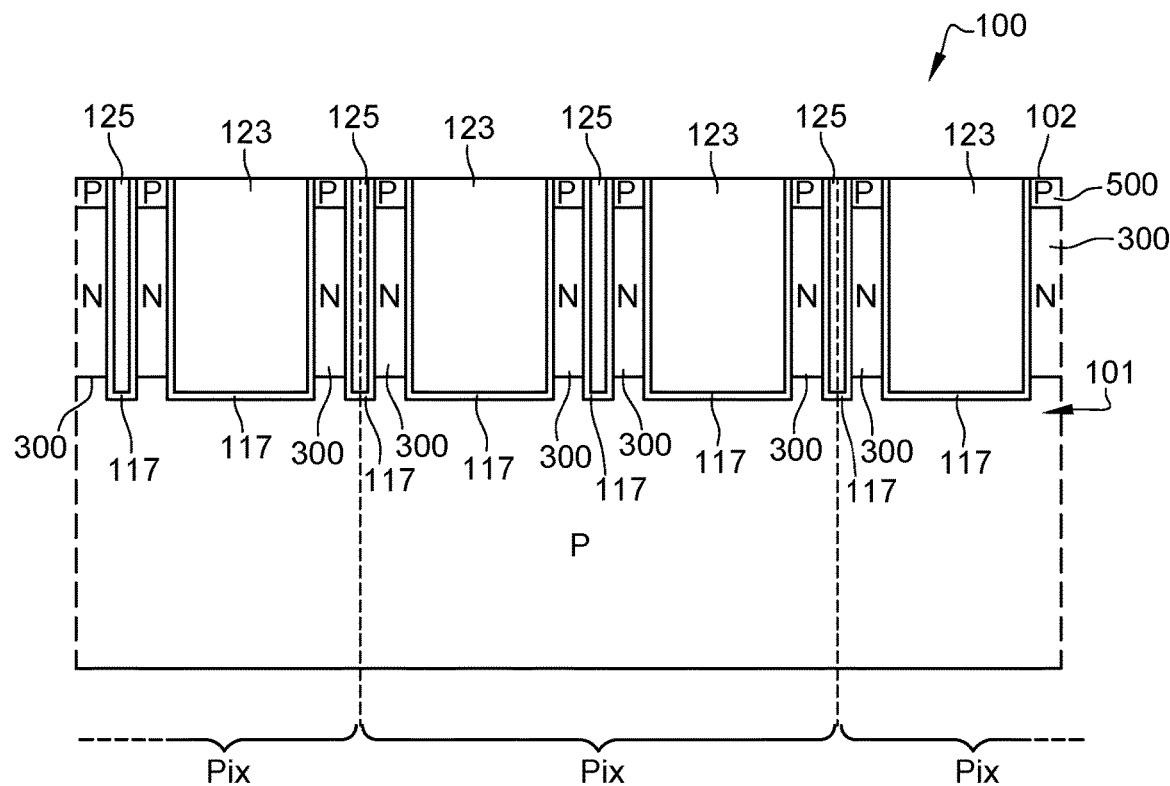
FIG. 5 is a simplified cross-section view of the device of FIG. 4.
Figure 6:
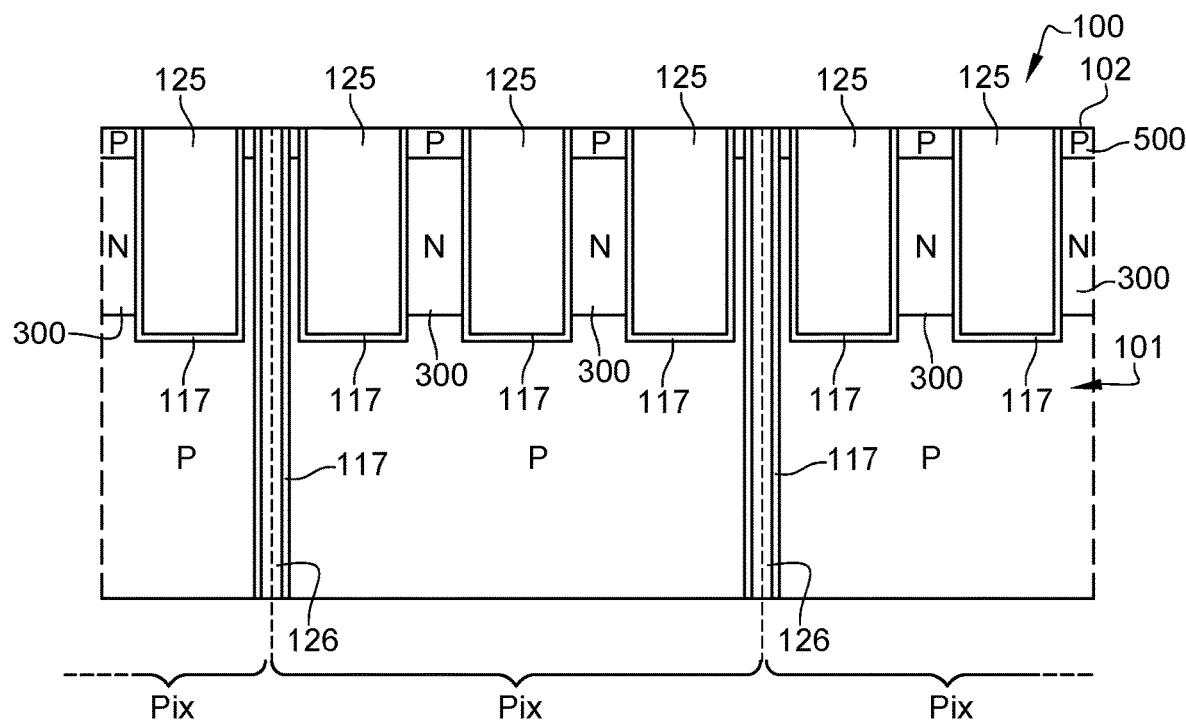
FIG. 6 is another simplified cross-section view of the device of FIG. 4.
Figure 7:
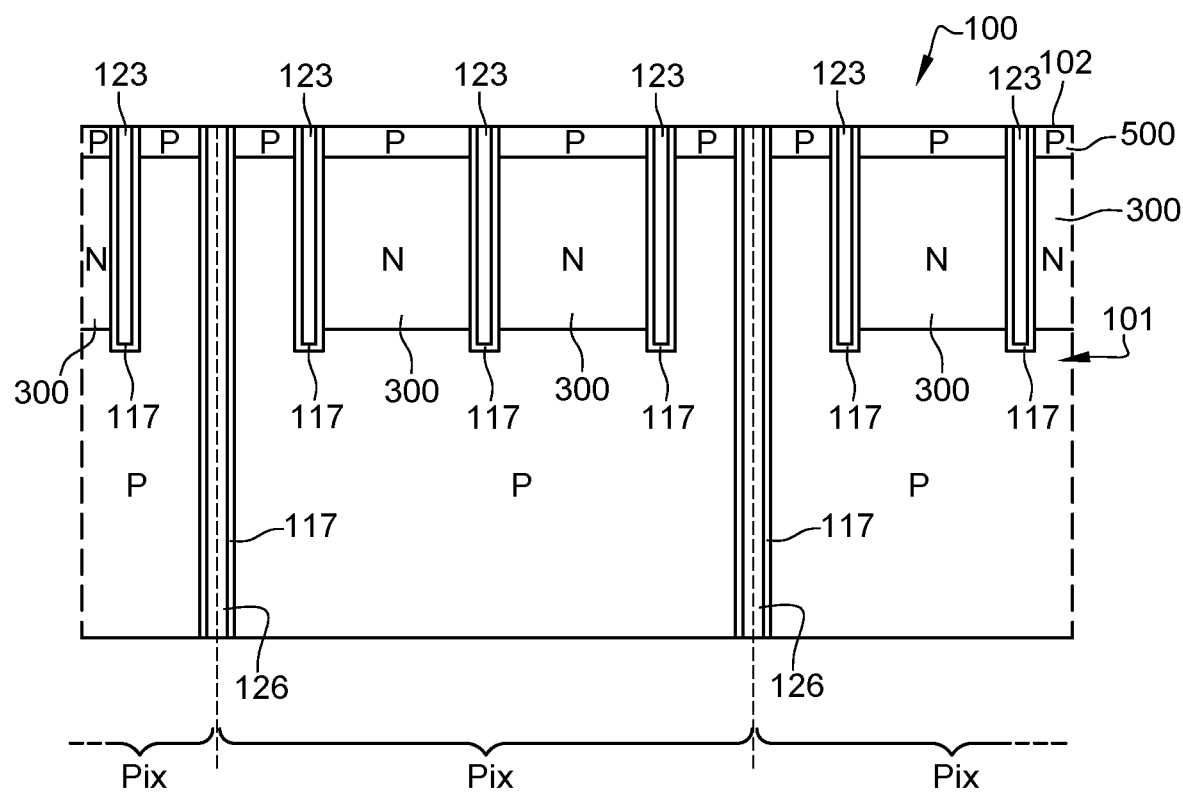
FIG. 7 is still another simplified cross-section view of the device of FIG. 4.

FIGS. 4, 5, 6, and 7 schematically show a charge-coupled device 100 according to an embodiment. FIG. 4 is a simplified top view of a portion of device 100, FIGS. 5, 6, and 7 are simplified cross-section views along respective planes B-B, C-C, and D-D of FIG. 4.

According to an embodiment, device 100 belongs to a light sensor, preferably an image sensor, device 100 then forming the photoconversion area of the sensor.

Device 100 comprises a semiconductor substrate 101 (FIGS. 5, 6, and 7), for example, made of silicon.

Device 100 comprises an array of insulated longitudinal electrodes 123 and of insulated transverse electrodes 125 that are physically separated from each other. Electrodes 123 and 125 penetrate vertically into substrate 101, from a surface 102 of substrate 101 (the upper surface in FIGS. 5, 6, and 7).

In the illustrated embodiment, all electrodes 123 and 125 penetrate vertically into substrate 101 down to a same depth.

Electrodes 123, 125 are each formed of at least one electrically-conductive material, for example, doped polysilicon, vertically penetrating into the substrate and being insulated from substrate 101 by at least one insulating layer 117, for example, a silicon oxide layer 117. More particularly, electrodes 123, 125 are each formed of a trench vertically penetrating into substrate 101 and filled with the electrically-conductive material(s) of the electrode, the trench walls having been previously coated with layer 117.

Electrode array 123 and 125 comprises rows 127 (FIG. 4) of alternated longitudinal and transverse electrodes 123 and 125. In other words, in each row 127 of electrodes 123, 125, for each pair of successive longitudinal electrodes 123 of row 127, the two longitudinal electrodes 123 are separated from each other by a transverse electrode 125 of row 127. Symmetrically, for each pair of successive transverse electrodes 125 of row 127, the two transverse electrodes 125 are separated from each other by a longitudinal electrode 123 of row 127.

In each row 127 of electrodes 123, 125, longitudinal electrodes 123 are aligned with one another. Further, longitudinal electrodes 123 are parallel to rows 127 and to a charge transfer direction in device 100. In each row 127, transverse electrodes 125 are orthogonal to longitudinal electrodes 123.

In each row 127, each end of each longitudinal electrode 123 is opposite a portion, preferably central, of a transverse electrode 125 adjacent to row 127. Further, in each row 127, each end of each longitudinal electrode 123 is separated from the adjacent transverse electrode 125 by a space e2 (FIG. 4).

As can be seen in FIG. 4, electrodes 123, 125 form, in a direction orthogonal to rows 127, columns 129 of longitudinal electrodes 123 alternated with columns 131 of transverse electrodes 125. In each column 131, the ends of two electrodes 125 of two adjacent rows 127 are opposite each other, and are separated from each other by a space e3. In each column 129, the longitudinal electrodes 123 of two adjacent rows 127 are opposite each other. In each column 131, the transverse electrodes 125 of column 131 are aligned.

Device 100 further comprises electric insulation walls 126 vertically penetrating into substrate 101. Walls 126 penetrate into substrate 101 from surface 102 of substrate 101 (FIGS. 5, 6, and 7). Walls 126 penetrate deeper into substrate 101 than longitudinal electrodes 123. In the embodiment illustrated in FIGS. 4, 5, 6, 7, walls 126 cross substrate 101 across its entire thickness. In variants, not illustrated, walls 126 penetrate vertically into substrate 101 across a portion only of the thickness thereof.

Walls 126 are parallel to one another and parallel to longitudinal electrodes 123. In other words, walls 126 are parallel to rows 127 or, still in other words, to the charge transfer direction in device 100.

At least two rows 127 of electrodes 123, 125 are arranged between each two successive walls 126. The rows 127 arranged between two successive walls 126 are adjacent to each other when there are only two rows 127 between the two successive walls 126, and are adjacent two by two when there are at least three rows 127 between the two successive walls 126. Two rows 127 of electrodes 123, 125 are called adjacent if they are not separated from each other by a wall 126. In the example of FIGS. 4, 5, 6, and 7, three rows 127 of electrodes 123, 125 are arranged between each two successive walls 126.

In the illustrated embodiment, walls 126 are insulated conductive walls. In other words, walls 126 are each formed of at least one electrically-conductive material, for example, made of the same conductive materials as electrodes 123, 125, vertically penetrating into substrate 101 and being insulated from substrate 101 by at least one insulating layer 117, for example, a silicon oxide layer 117 such as that of electrodes 123, 125. More particularly, walls 126 are each formed of a trench vertically penetrating into substrate 101, deeper than the trenches of longitudinal electrodes 123, filled with the electrically-conductive material(s) of walls 126, the trench walls having been previously coated with insulating layer 117.

Between two successive walls 126, two adjacent rows 127 of electrodes 123, 125 define a plurality of successive photoconversion areas of device 100, the photoconversion areas located between two adjacent rows 127 being aligned in the charge transfer direction. In other words, between two adjacent rows 127 arranged between two successive walls 126 are defined photoconversion areas of device 100.

Substrate 101 is doped with a first conductivity type, for example, type P (FIGS. 5, 6, and 7). Further, on the side of its surface 102 (FIGS. 5, 6, and 7), between each two adjacent rows 127, substrate 101 comprises a doped region 300 of the second conductivity type, in the present example, type N. Region 300 penetrates into substrate 101 down to a depth smaller than or equal to the depth down to which longitudinal electrodes 123 penetrate. In other words, on the side of surface 102 of substrate 101, for example, from surface 102, region 300 penetrates into substrate 101 down to a depth smaller than or equal to the depth of longitudinal electrodes 123. Each N-type region 300 is in contact with an underlying portion of P-type doped substrate 101, with which they form photoconversion areas of device 100.

Between each two adjacent rows 127 of electrodes 123, 125, the corresponding region 300 extends laterally at least along the entire length of the two rows 127 (FIG. 5), and at least from one to the other of the two adjacent rows 127 (FIG. 7). In other words, between each two adjacent rows 127, region 300 extends lengthwise at least along the entire length of rows 127, and widthwise at least from one to the other of two adjacent electrodes 123, and opposite a same column 129. Still in other words, each region extends widthwise at least over a space e4 between two adjacent electrodes 123 and opposite a same column 129.

According to the illustrated embodiment, between each two successive walls 126, regions 300 correspond to portions of an N-type doped well vertically penetrating into substrate 101 (FIGS. 5, 6, and 7). The well extends lengthwise at least along the entire length of the rows 127 arranged between the two successive walls 126. Further, the well extends widthwise at least from the electrodes 123 of the row 127 closest to a first one of two successive walls 126 to the electrodes 123 of the row 127 closest to the other one of the two successive walls 126. Between each two successive walls 126, the wall is thus crossed by all the electrodes 123, 125 of the rows 127 arranged between the two walls 126, an electrode 125 being considered as crossing the well if at least a portion of electrode 125 crosses the well.

Preferably, as shown in FIGS. 6 and 7, between each two successive walls 126, the well does not extend widthwise from one to the other of the two walls 126. In other words, walls 126 are not in contact with regions 300, substrate 101 being then deprived of an N-type region 300 between each wall 126 and the electrodes 123, 125 of each row adjacent to this wall 126. Still in other words, substrate 101 comprises, between each wall 126 and each row 127 adjacent to this wall 126, a P-type area separating the well from wall 126, such a P-type area preferably extending from wall 126 to the electrodes 123 of row 127. A row 127 is called adjacent to a wall 126, for example, if this row 127 is that which is closest to wall 126 among the rows 127 which are arranged between this wall 126 and a next wall 126.

The omission of areas 300 between each wall 126 and the row(s) 127 of electrodes 123, 125 adjacent to this wall 126 enables to avoid for photogenerated charges to accumulate between a wall 126 and the electrodes 123, 125 of a row 127 adjacent to this wall 126.

Preferably, substrate 101 further comprises a P-type doped layer 500 extending under the surface 102 of substrate 101 and covering, on the side of surface 102, regions 300. In top view, layer 500 extends over the entire surface of the array of electrodes 123, 125 or, in other words, lengthwise along the entire length of rows 127 and widthwise along the entire length of columns 129, 131. Layer 500 has a surface (the upper surface in FIGS. 5, 6, and 7) confounded with the surface 102 of substrate 101. Preferably, layer 500 is more heavily P-type doped than substrate 101, that is, more heavily P-type doped than the P-type doped portion of substrate 101 which is in contact with regions 300.

Layer 500 is used as a passivation layer to avoid for photogenerated charges to remain trapped in surface or interface defects at the level of surface 102 of substrate 101. Further, layer 500 may also be used to apply a bias potential to P-type doped substrate 101.

In device 100, space e3 (FIG. 4) is preferably selected in the same way as space e1 in the sensor of U.S. Pat. No. 8,937,341 described in relation with FIGS. 1 and 2. As an example, space e3 is in the range from 0.2 to 0.6 µm, for example, equal to 0.3 µm.

In devices 100, space e2 (FIG. 4) is, for example, in the range from 0.1 to 0.5 µm, for example, equal to 0.2 µm. As an example, space e2 has dimensions smaller than those of space e3.

In device 100, the space e4 (FIG. 4) between two electrodes 123 opposite two adjacent rows 127 is selected so that, when electrodes 123 are properly biased as will be described in further detail hereafter, a potential well forms between electrodes 123, in the region 300 between these electrodes 123, to accumulate therein photogenerated charges, that is, electrons in the example described in relation with FIGS. 4 to 7. As an example, space e4 is in the order of 1 µm, for example, equal to 1 µm.

In device 100, the length e5 (FIG. 4) of electrodes 123 (measured in a direction parallel to rows 127) is, for example, in the range from 2 to 10 µm, for example, in the order of 5 µm, for example, equal to 5 µm. Preferably, electrodes 123 are longer than electrodes 125.

In device 100, the space e6 (FIG. 4) between a wall 126 and an electrode 123 of a row 127 adjacent to wall 126 is in the order of 1 µm or less.

In device 100, the length e7 (FIG. 4) of electrodes 125 (measured in a direction parallel to the direction of columns 131 and 129) is, for example, in the range from 1.2 to 0.8 μm, for example in the order of 0.8 μm, for example, equal to 0.8 μm.

As an example, substrate 101 has a thickness in the range from 3 to 30 μm, for example, a thickness in the order of 20 μm, for example, equal to 20 μm. The thickness of regions 300 is, for example, in the range from 1 to 5 μm, for example, in the order of 2 μm, for example, equal to 2 μm. Layer 500 has a thickness, for example, in the range from 100 to 500 nm, for example in the order of 300 nm, for example, equal to 300 nm.

In device 100, walls 126 laterally delimit, in the direction of columns 129 and 131, the pixels Pix of device 100, that is, the pixels Pix of the light or image sensor comprising device 100. In other words, device 100 comprises, between each two successive walls 126, a row 700 of successive pixels Pix (FIG. 4). In the example of FIG. 4, three rows 700 of pixels Pix are shown, the rows 700 at the top and at the bottom of FIG. 4 being only partially shown. Pixels Pix are delimited by dotted lines. In FIG. 4, only the pixel Pix arranged at the center of the drawing is entirely shown, its neighboring pixels Pix being only partially shown.

In the direction of columns 129, 131, pixels Pix are organized in columns 701 of pixels Pix. The pixels Pix of each column 701 are laterally delimited, in the direction of rows 127, 700, by the transverse electrodes 125 of two columns 131 separated from each other by at least one other column 131 of electrodes 125, for example, by a single other column 131 of electrodes 125 as illustrated in FIG. 4.

As can be seen in FIG. 4, two adjacent pixels Pix of a same row 700 share the electrodes 125 of the column 131 separating these two pixels Pix.

Thus, each pixel Pix comprises, between the two walls 126 delimiting this pixel Pix, the electrodes 125 of the columns 131 delimiting this pixel Pix and the electrodes 125 and 123 of the respective columns 131 and 129 arranged between the columns 131 delimiting pixel Pix.

For example, in FIG. 4, each pixel Pix comprises the three electrodes 125 of a first column 131 delimiting this pixel Pix on a first side, the three electrodes 125 of a second column 131 delimiting this pixel on a second side opposite to the first side, the three electrodes 123 of each of the columns 129 arranged between the first and second columns 131, and the three electrodes 125 of the column 131 arranged between the first and second column 131.

In operation, when electrodes 123 and 125 are biased in adapted fashion, each pair of electrodes 123 opposite two adjacent rows 127 defines a potential well between these electrodes 123 and more particularly in the region 300 between these electrodes 123. In the example of FIG. 4, each pixel Pix comprises four potential wells.

Figure 1:
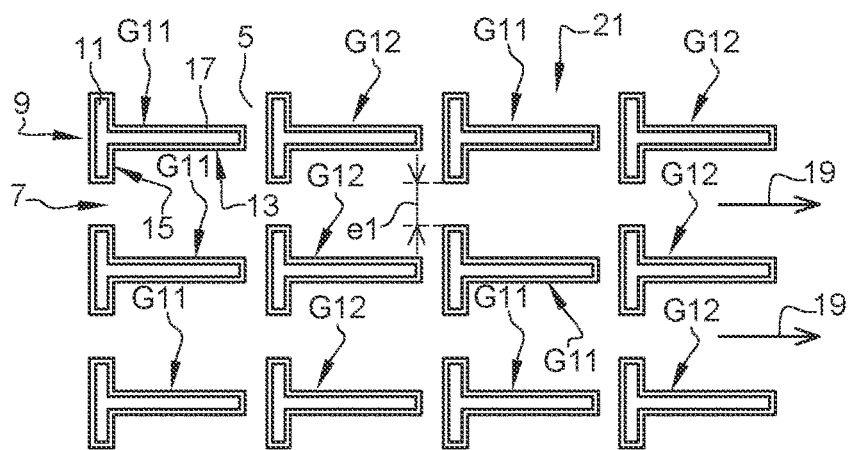
FIG. 1, previously described, is a simplified top view of an example of an image sensor described in U.S. Pat. No. 8,937,341.
Figure 2:
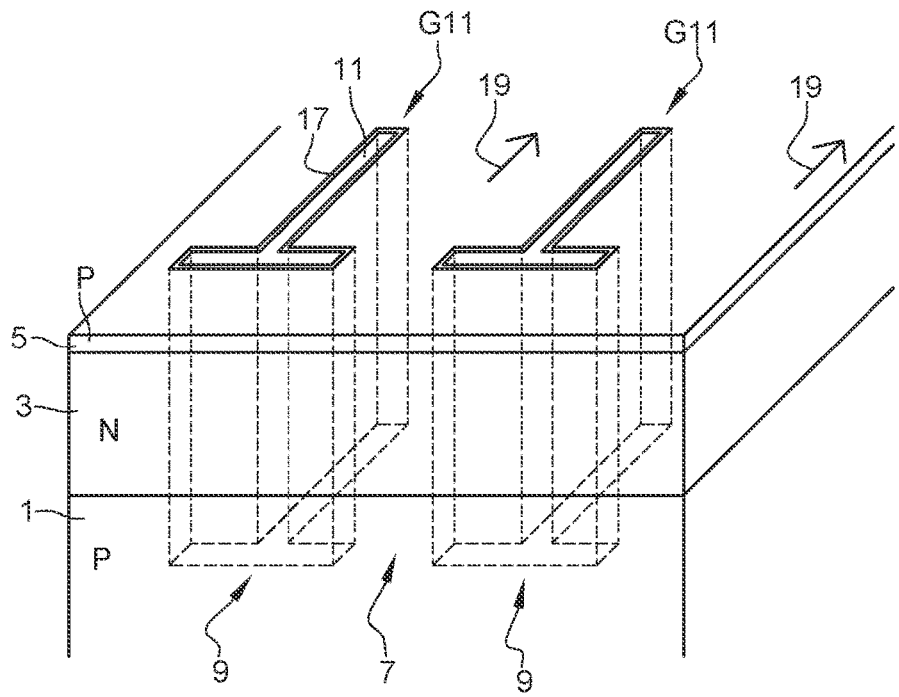
FIG. 2, previously described, is a simplified perspective cross-section view of the example of an image sensor described in U.S. Pat. No. 8,937,341.
Figure 3:
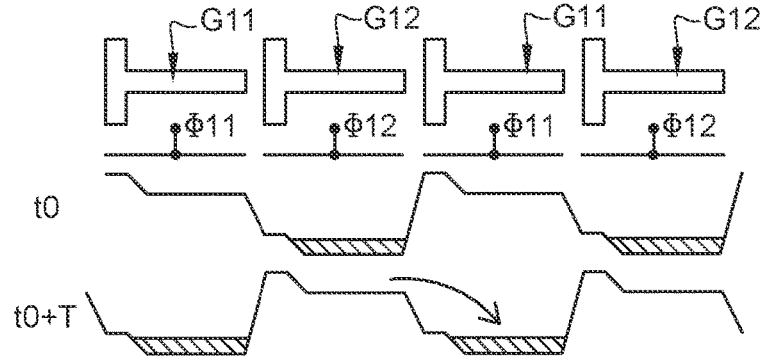
FIG. 3, previously described, is a copy of FIG. 9 of U.S. Pat. No. 8,937,341 and illustrates a charge transfer in the sensor of FIGS. 1 and 2.

As compared with the pixels described in relation with FIGS. 1 to 3, the pixels Pix of device 100 have a larger surface area. In the example of FIG. 4, each pixel Pix corresponds to approximately 4 pixels of U.S. Pat. No. 8,937,341.

To increase the surface area of the pixels of U.S. Pat. No. 8,937,341, it could have been devised to increase the space between rows 27 and to increase the length of the longitudinal bars 13 of the electrodes. However, the control of the potential well between the bars 13 of two opposite electrodes 17 would then have required applying to electrodes 123, 125 potentials having higher values, which would have resulted in an increase of the electric power consumed by the device. This is not necessary in device 100, where the distance between two opposite electrodes 123 is for example substantially the same as between two opposite bars 13 of the device of U.S. Pat. No. 8,937,341.

In the device of U.S. Pat. No. 8,937,341, it could also have been devised to gather a plurality of adjacent pixels to form a larger pixel. However, photogenerated charges might have leaked between pixels of adjacent rows. In device 100, such a photogenerated charge leakage between pixels Pix of adjacent rows 700 is decreased, or even suppressed, by the provision of the wall 126 separating the rows 700 of pixels Pix from one another.

In a device of the type of that of U.S. Pat. No. 8,937,341 where a plurality of adjacent pixels would have been gathered to form a larger pixel, insulated electrodes 11 penetrating into the substrate down to the same depth as the walls 126 of device 100 could have been provided, to limit charge leakages between neighboring rows of pixels. However, this would have resulted in electrodes 11 deeper than the electrodes 123 of device 100, and thus in electrodes 11 having capacitance values greater than those of the electrodes 123 of device 100. Now, high capacitance values result in that the power consumed to bias such capacitances is also higher, which is not desirable.

In operation, P-type substrate 101 is set to a reference potential, for example, the ground, the reference potential being for example applied to the layer 500 of substrate 101. Thus, the photogenerated charges which are not intended to be accumulated in pixels Pix and which are not intended to be transferred between these pixels Pix are discharged to this reference potential. In the example illustrated in FIGS. 4 to 7, the useful photogenerated charges are electrons, and the photogenerated holes are discharged to the reference potential applied to substrate 101.

Further, preferably, a negative or zero potential is applied to insulated conductive walls 126, so that holes accumulate along the sides of walls 126. This results in a decrease in the dark current with respect to the case where insulated conductive walls 126 would be biased to a positive potential.

In each row 127 of device 100, one longitudinal electrode 123 out of two receives a control signal A, the other longitudinal electrodes 123 of row 127 receiving a control signal B. In each pixel Pix, the electrodes 123 of a same column 129 are electrically coupled together, and the electrodes 125 of a same column 131 are electrically coupled together.

In the following description, a longitudinal electrode 123 is said to be "coupled" to a transverse electrode 125 when the same control signal is applied to the two electrodes 123 and 125. As will be described in further detail hereafter, to obtain a transfer towards the right, each longitudinal electrode 123 is coupled to the adjacent transverse electrode 125 arranged on its left-hand side, that is, upstream with respect to the charge transfer direction. To obtain a charge transfer towards the left, each longitudinal electrode 123 is coupled to the adjacent transverse electrode 125 located on its right-hand side, that is, here again, upstream with respect to the charge transfer direction. A charge transfer between two adjacent successive potential wells in the charge transfer direction is then ensured by successive switchings, between high and low states H and L, in two phases, of the control signals A and B applied to electrodes 123 and 125.

A potential well between two opposite electrodes 123 is deeper when the control signal A or B applied to these electrodes 123 is at high level H than when it is a low level L.

Conversely, a potential barrier in space e3 between the opposite ends of two adjacent electrodes 125 is higher or greater when the control signal A or B applied to these two electrodes is at low level L than when it is in high level H.

Further, levels H and L and space e3 are selected so that, when the control signal A or B applied to two electrodes 125 having opposite ends is at high level H, the potential barrier in the space e3 between these electrodes is at an intermediate level between the level of a deep potential well between two opposite electrodes 123 receiving a control signal A or B at state H and the level of a shallower potential well between two opposite electrodes 123 receiving a control signal A or B at state L. Further, levels H and L and space e3 are selected so that, when the control signal A or B applied to two electrodes 125 having opposite ends is at low level L, the potential barrier in space e3 between these electrodes is sufficiently high to block a charge conduction, via space e3, between two successive adjacent potential wells in the charge transfer direction.

Figure 8:
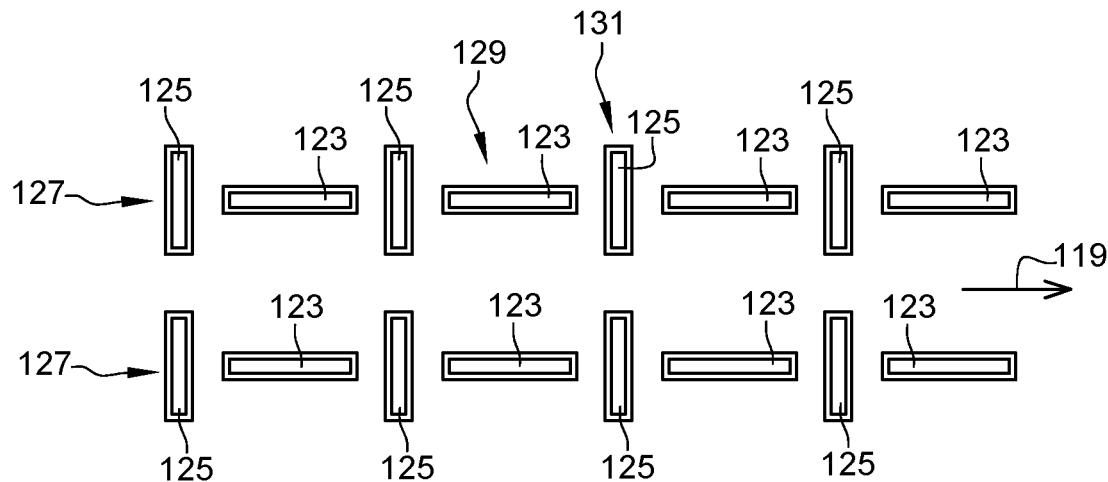
FIG. 8 is a partial copy of FIG. 4.
Figure 9:
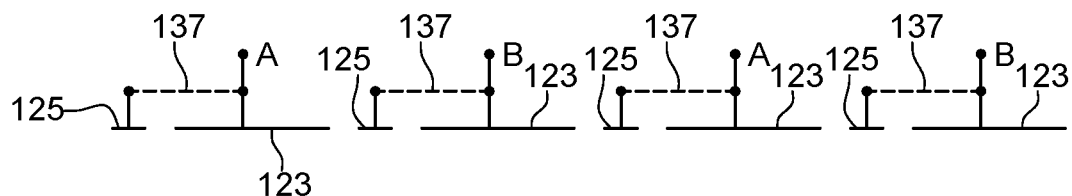
FIG. 9 illustrates, in relation with FIG. 8, a first implementation mode of a method of controlling the device of FIG. 4.
Figure 10:
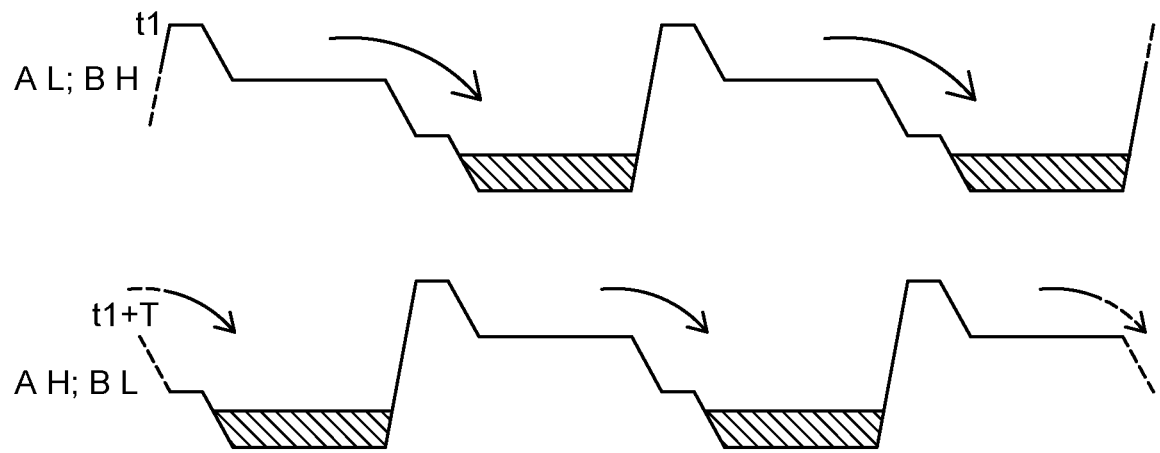
FIG. 10 illustrates, in relation with FIGS. 8 and 9, the first implementation mode of a method of controlling the device of FIG. 4.

FIGS. 8, 9, and 10 illustrate a mode of control of device 100 during a light (or image) acquisition step and during two phases of a charge transfer towards the right (arrow 119 in FIG. 8), between two successive adjacent potential wells arranged between two adjacent rows 127. FIG. 8 is a top view partially showing these two adjacent rows 127, FIG. 9 illustrates how control signals A and B are applied to the electrodes 123 and 125 of these rows 127, and FIG. 10 schematically shows, at successive times t1 and t1+T, the wells and potential barriers between the respective electrodes 123 and 125 of these two adjacent rows 127.

In this case where the charge transfer is performed towards the right (arrow 119), each longitudinal electrode 123 is coupled to the transverse electrode 125 located on its left-hand side, that is, upstream of electrode 123 with respect to the charge transfer direction. The couplings between longitudinal and transverse electrodes 123 and 125 are represented by dotted lines 137 in FIG. 9.

At a time t1 corresponding to the end of an image acquisition step, control signal A is in low state L, for example, at a negative or zero potential, for example, in the range from 0 V to −2 V, and control signal B is in high state H, for example, at a positive potential, for example, in the range from 2 V to 5 V, for example, in the order of 3 V.

As an example, the low level L of signals A and B corresponds to a negative or zero potential, for example, in the range from 0 V to −2 V, for example in the order of −1 V. The high level H of signals A and B for example corresponds to a positive potential, for example, in the range from 2 V to 5 V, for example, in the order of 3 V.

As shown in FIG. 10, the electrons originating from the photoconversion (shown by the hatched areas of FIG. 10) are stored in the potential wells between the opposite longitudinal electrodes 123 receiving signal B in high state H.

At a time t1+T, T being the clock period driving the charge transfer, the levels of control signals A and B are switched, which causes the synchronous shifting of the electron bunches to the right.

At a time t1+2T (not shown), the levels of control signals A and B are switched, which causes the synchronous shifting of the electron bunches to the right.

In the example of FIG. 4 where each pixel Pix comprises, between the two walls 126 which delimit it, the electrodes 123 of two successive columns 129, the photogenerated electrons accumulated in a pixel Pix at time t1 have been shifted, at time t1+2T, into the adjacent right-hand pixel Pix.

Figure 11:
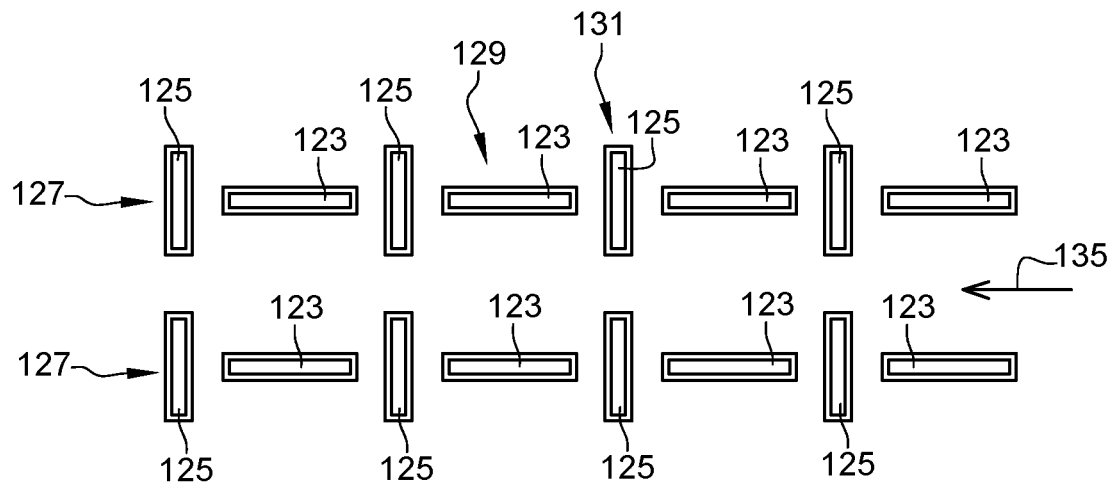
FIG. 11 is a partial copy of FIG. 4.
Figure 12:
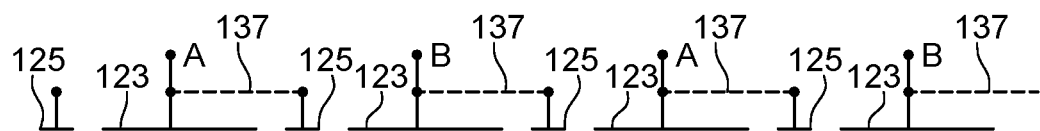
FIG. 12 illustrates, in relation with FIG. 11, a second implementation mode of a method of controlling the device of FIG. 4.
Figure 13:
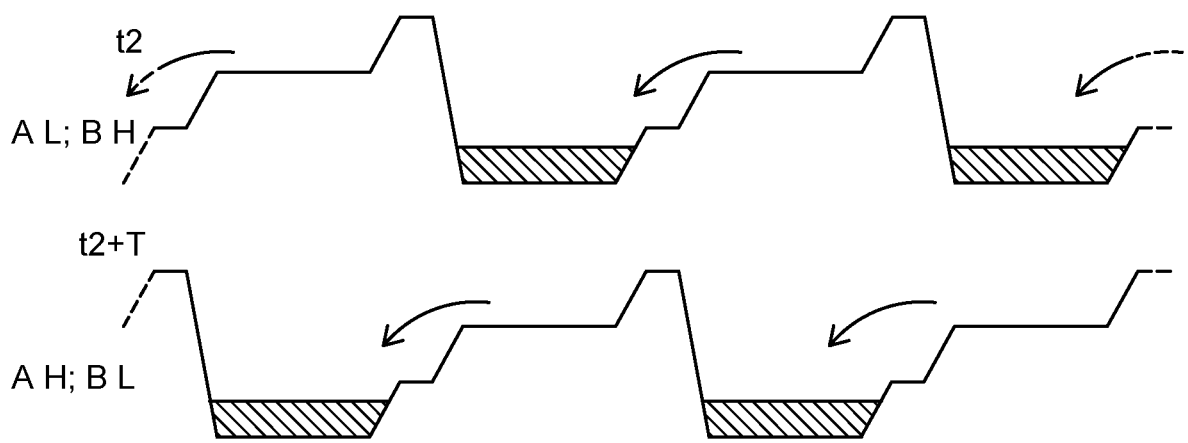
FIG. 13 illustrates, in relation with FIGS. 11 and 12, the second implementation mode of a method of controlling the device of FIG. 4.

FIGS. 11, 12, and 13 illustrate another mode of control of device 100 during a light or image acquisition step and during two phases of a charge transfer towards the left (arrow 135 in FIG. 11), between two successive adjacent potential wells arranged between two adjacent rows 127. FIG. 11 is a top view partially showing these two adjacent rows 127, FIG. 12 illustrates how control signals A and B are applied to the electrodes 123 and 125 of these rows 127, and FIG. 13 schematically shows, at successive times t2 and t2+T, the potential well and barriers between the respective electrodes 123 and 125 of these two adjacent rows 127.

In this case where the charge transfer is performed towards the left (arrow 135 in FIG. 11), each longitudinal electrode 123 is coupled to the transverse electrode 125 located on its right-hand side. The couplings between longitudinal and transverse electrodes 123 and 125 are shown by dotted lines 137 in FIG. 12.

At a time t2 corresponding to the end of a light or image acquisition step, control signal A is in low state L and control signal B is in high state H, and the photogenerated electrons are stored in the potential wells between the opposite longitudinal electrodes 123 receiving signal B in high state H.

At a time t2+T, the levels of the respective control signals A and B are switched, which causes the synchronous shifting to the left of the electron bunches.

At a time t2+2T (not shown), the levels of the respective control signals A and B are switched, which causes the synchronous shifting to the left of the electron bunches.

In the example of FIG. 4 where each pixel Pix comprises, between the two walls 126 which delimit it, the electrodes 123 of two successive columns 129, the photogenerated electrons accumulated in a pixel Pix at time t2 have been shifted, at time t2+2T, into the adjacent left-hand pixel Pix.

An advantage of device 100, in particular over the device of U.S. Pat. No. 8,937,341, is that it allows a charge transfer in a first direction 119 (FIG. 8) and in a second direction 135 (FIG. 11) opposite to the first direction.

Figure 14:
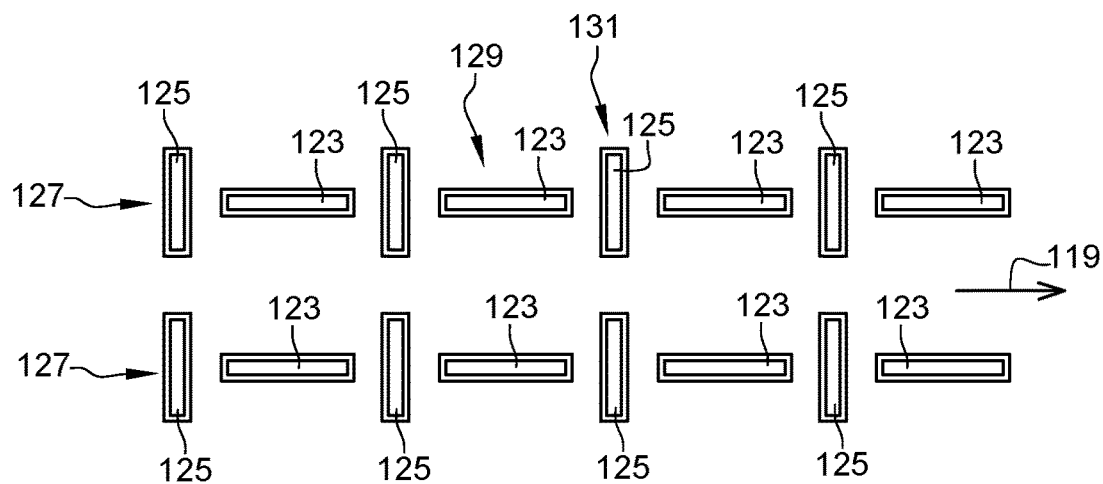
FIG. 14 is a partial copy of FIG. 4.
Figure 15:
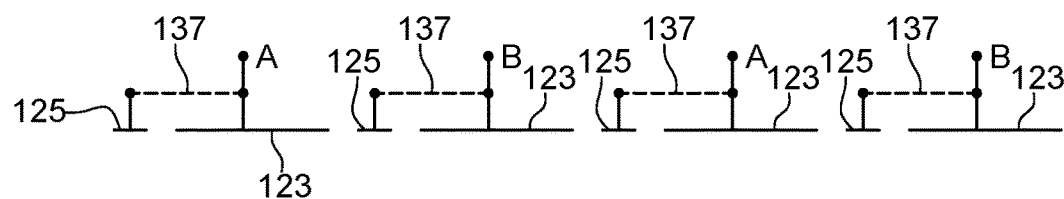
FIG. 15 illustrates, in relation with FIG. 14, a third implementation mode of a method of controlling the device of FIG. 4.
Figure 16:
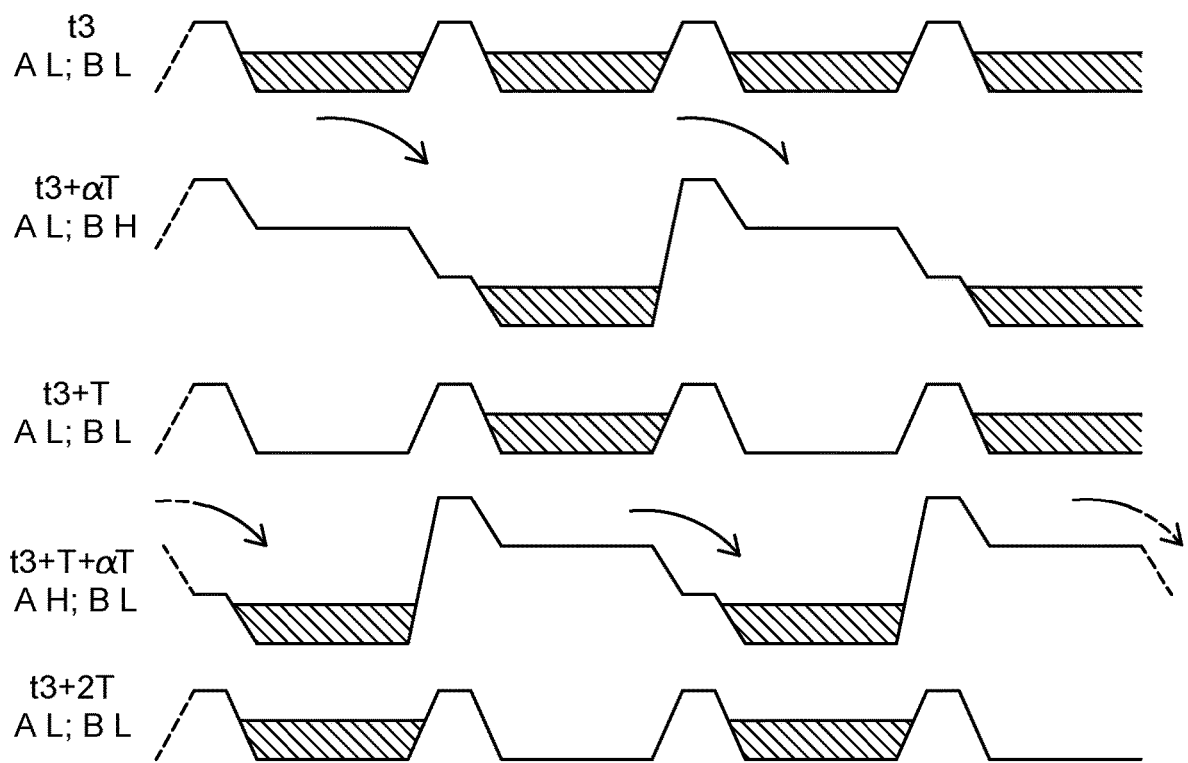
FIG. 16 illustrates, in relation with FIGS. 14 and 15, the third implementation mode of a method of controlling the device of FIG. 4.

FIGS. 14, 15, and 16 illustrate an alternative control of device 100, during a light (or image) acquisition step and during two phases of a charge transfer towards the right (arrow 119 in FIG. 14), between two successive adjacent potential wells arranged between two adjacent rows 127. FIGS. 14 and 15 correspond to FIGS. 9 and 10, and FIG. 16 schematically shows the potential wells and barriers between the respective electrodes 123 and 125 of these two adjacent rows 127, at successive times t3, t3+αT, t3+T, t3+T+αT, and t3+2T, α being smaller than 1 and greater than 0, preferably greater than 0.5, and more preferably still greater than 0.75.

In this example where the charge transfer is performed towards the right, each longitudinal electrode 123 is coupled to the adjacent transverse electrode 125 located on its left-hand side, as illustrated by dotted lines 137 in FIG. 15.

At a time t3 corresponding to the end of a light or image acquisition step, the two control signals A and B are in low state L. The electrons originating from the photoconversion are stored in the potential well between longitudinal electrodes 123.

At a time t3+αT, only control signal B is switched, to high state H. As a result, the electrons stored in the potential wells between longitudinal electrodes 123 receiving signal A in low state L are synchronously shifted to the right in the potential wells between the longitudinal electrodes receiving signal B in high state H.

At a time t3+T corresponding to the end of the first phase of the transfer and to the beginning of the second phase of the transfer, only control signal B is switched and the electrons remain stored in the potential wells between the longitudinal electrodes receiving signal B at low state L.

At a time t3+T+αT, only control signal A is switched, to high state H. As a result, the electrons stored in the potential wells between longitudinal electrodes 123 receiving signal B in low state L are synchronously shifted to the right in the potential wells between the longitudinal electrodes receiving signal A in high state H.

At a time t3+2T corresponding to the end of the transfer, only control signal A is switched. The electron bunches remain stored in the potential wells between the longitudinal electrodes receiving signal A.

In the example of FIG. 4 where each pixel Pix comprises, between the two walls 126 which delimit it, the electrodes 123 of two successive columns 129, the photogenerated electrons accumulated in a pixel Pix at time t3 have been shifted, at time t3+2T, into the adjacent right-hand pixel Pix.

In the control modes described in relation with FIGS. 8 to 10, 11 to 13, and 14 to 16, a two-phase charge transfer has a duration 2T. However, in the control mode of FIG. 14 a 15, for the duration 2T of a two-phase charge transfer, each of signals A and B is in a high state for a time period $(1-\alpha)*T$, and is in low state for a time period $(1+\alpha)*T$. However, in the control modes of FIGS. 8 to 10 and 11 to 13, for the duration 2T of a two phase transfer, each of control signals A and B is in a low state for a time period T, shorter than a time period $(1+\alpha)*T$.

When an electrode 123 or 125 receives a control signal in the low state corresponding to a negative or zero potential level, holes accumulate along the walls of this electrode, which results in a decrease in the dark current with respect to the case where the electrode receives a control signal in the high state corresponding to a positive potential level. Thus, the control mode of FIGS. 14 to 16 enables to decrease the dark current in the sensor with respect to the control modes of FIGS. 5 to 8 and 9 to 11.

Although an alternative control of the sensor in the case of a charge transfer to the right (arrow 119) has been described in relation with FIGS. 14 to 16, it will be within the abilities of those skilled in the art to adapt this alternative control to the case of a transfer to the left (arrow 135, FIG. 11), by coupling each longitudinal electrode 123 to the adjacent transverse electrode 125 located on its right-hand side.

In the control modes and variants described hereabove in relation with FIGS. 8 to 10, 11 to 13, and 14 to 16, two coupled electrodes receive the same control signal A and B.

According to an alternative control, the high and/or low potentials applied to a transverse electrode 125 may be different from the respective high and/or low potentials applied to the longitudinal electrode 123 with which it is coupled. This advantageously enables to adapt, for the acquisition step and/or for each of the two steps of the transfer, the height of the potential barriers with respect to the depth of the adjacent potential wells. This is not possible in the sensor of FIGS. 1 and 2 where a same potential is applied to the transverse and longitudinal bars of a same electrode 11.

According to another alternative control, compatible with the alternative control described hereabove, the signal A or B received by a transverse electrode 125 is phase leading over the signal, respectively A or B, received by the longitudinal electrode 123 with which it is coupled. The switchings to the high or low state of the control signal A or B received by a transverse electrode 125 thus occur before the corresponding switchings of the control signal, respectively A or B, received by the longitudinal electrode 123 with which transverse electrode 125 is coupled. Thus, the height of the potential barrier between two successive potential wells of a row 127 is modified before the depth of one and/or the other of the two wells, which results in a better control of the charge transfer. In particular, this enables to avoid unwanted charge transfers to the left or to the right during a charge shift to the right or to the left, respectively.

In the two above-described alternative control modes, a longitudinal electrode 123 is said to be "coupled" to a transverse electrode 125 when these electrodes receive similar control signals, that is, signals having high states H corresponding to different potentials and/or low states L corresponding to different potentials, and/or a control signal of electrode 125 ahead of the control signal of electrode 123.

Further, as in the sensor of FIGS. 1 and 2, during the acquisition step, any other mode of biasing of electrodes 123 and 125 can be envisaged with respect to the control modes described as an example in relation with FIGS. 8 to 10, 11 to 13, and 14 to 16.

Control modes where acquisition phases alternate with readout phases, each of which comprises shifting all the photogenerated electron bunches stored in rows 700 (FIG. 4) of pixels Pix all the way to the ends of these row 700 to be read out therein, have been described. In this case, during sensor readout phases, the photosensitive areas of the sensor are, for example, masked by a shutter.

As a variant, a sensor of the type of that in FIGS. 4 to 7 is switched as a time delay integration sensor or TDI sensor. The transfers of electron bunches between adjacent pixels are then synchronized with the displacement speed of the object, the image of which is desired to be acquired. In this case, an image acquisition phase is for example carried out after each charge transfer between two adjacent pixels and the acquired images are superimposed. The sensor may then not be masked during transfer phases. A TDI sensor is for example used to capture an image of a spatial object such as a comet or a planet having a known a substantially constant displacement speed.

In the embodiment of device 100 described in relation with FIGS. 4 to 7, electrodes 125 and electrode 123 penetrate into substrate down to a same depth.

According to an alternative embodiment, the electrodes 125 laterally delimiting the pixels Pix of device 100, in the row direction, penetrate into substrate 101 deeper than electrodes 123. Preferably, these electrodes 125 deeper than electrodes 123 penetrate into substrate 101 down to the same depth as walls 126, which enables to simultaneously form the trenches of electrodes 125 and of walls 126. The provision of deeper electrodes 125 to laterally delimit pixels Pix enables to limit charge leakages between adjacent pixels Pix of a same row 700 (FIG. 4).

According to another alternative embodiment, the internal electrodes 125 of a pixel Pix, that is, the electrodes 125 which belong to one or more columns 131 arranged between the two columns 131 comprising the electrodes 125 laterally delimiting pixel Pix or, in other words, the electrodes 125 of pixel Pix which do not laterally delimit this pixel Pix in the direction of rows 127, penetrate into substrate 101 deeper than electrodes 123. Preferably, the internal electrodes 125 deeper than electrodes 123 penetrate into the substrate down to the same depth as walls 126. The provision of such electrodes 125 deeper than electrodes 123 enables to limit charge leakages between adjacent potential wells in the direction of rows 127 of pixel Pix.

The two above alternative embodiments may be combined, all electrodes 125 then penetrating deeper into substrate 101 than electrodes 123.

In the embodiments and variants previously described in relation with FIGS. 4 to 16, walls 126 are insulated conductive walls. In an alternative embodiment, not illustrated, walls 126 may be electrically-insulating walls, made of one or a plurality of electrically-insulating materials. Preferably, in such a variant, a thin layer, for example, having a thickness in the range from 5 to 30 nm, and P-type doped, covers each wall 126, that is, the sides of wall 126 which are in contact with substrate 101, to decrease the dark current.

Further, in device 100, to favor the accumulation of the photogenerated electrons towards N-type regions 300, the P-type doped portion of substrate 101 which is arranged under and in contact with each of these regions 300 may exhibit a variation of its doping level as it is come closer to region 300.

Figure 17:
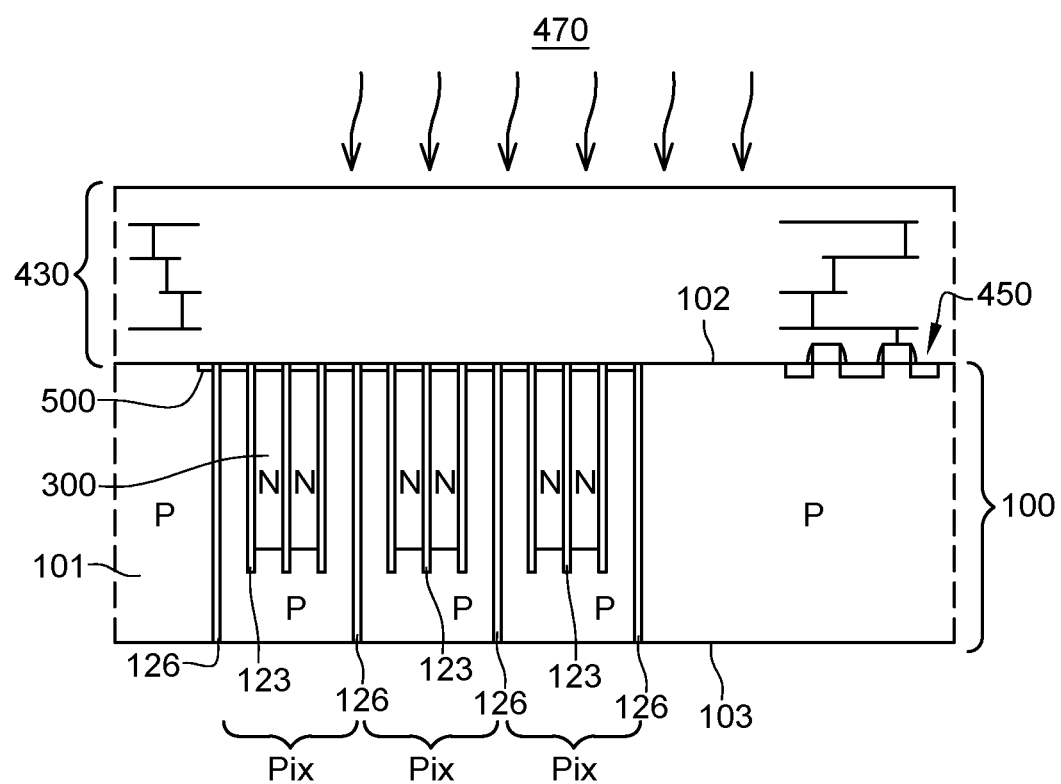
FIG. 17 is a simplified cross-section view of an embodiment of a light sensor comprising the device of FIG. 4.

FIG. 17 schematically shows in cross-section view a light or image sensor comprising device 100, according to an embodiment where the sensor is of front-side illuminated type. The view of FIG. 17 for example corresponds to a cross-section view along plane DD of FIG. 4. In this example, device 100 comprises three rows of pixels Pix.

The sensor comprises device 100. The front surface 102 of the substrate 101 of device 100, the upper surface in FIG. 17, is coated with an interconnection network or structure 430. Interconnection network 430 comprises metallization levels, each comprising portions of metal layers, the metallization levels being separated from each other by insulating layers and coupled together by conductive vias crossing the insulating layers. The electrodes 123 and 125 of device 100, only electrodes 123 being shown in FIG. 17, penetrate into substrate 101 from surface 102 thereof. Various components such as transistors 450 are also formed inside and/or on top of substrate 101, on the side of its surface 102.

Above pixels Pix, interconnection network 430 is deprived of portions of metal layers and of conductive vias and the light 470 received on the front surface reaches pixel Pix without being reflected by metal elements. The provision of areas deprived of metal layer portions and of vias in interconnection network 430 may be a problem for the forming of this network. Further, a portion of the light 470 received by the sensor may be absorbed by interconnection network 430, which decreases the sensor efficiency.

Thus, in an alternative embodiment, not illustrated, it is provided for a sensor comprising device 100 to receive the light 470 on the side of a surface 103 of substrate 101 opposite to surface 102, that is, on the back side of substrate 101.

Such a sensor, said to be back-side illuminated, comprises the same elements as the sensor of FIG. 17, with the difference that interconnection network 430 may comprise metal layer portions and conductive vias opposite the sensor pixels Pix, which simplifies the forming of network 430.

Advantageously, when light 470 is received on the back side 103 of the sensor, it does not cross interconnection network 430, which results in a better efficiency of the sensor.

Preferably, interconnection network 430 comprises, opposite the entire surface occupied by sensor pixels Pix, a metal layer, preferably in the metallization level closest to substrate 101. Thus, when light 470 received on the back side 103 of substrate 101 reaches a pixel Pix of the sensor and crosses the portion of substrate 101 corresponding to this pixel Pix, it is reflected by this metal layer towards this pixel Pix, which results in a better efficiency of the sensor.

The various embodiments of device 100 described hereabove benefits from the advantages of a small surface area, of simplicity of manufacturing and control, of transfer rapidity, etc. of the sensor described in U.S. Pat. No. 8,937,341.

Specific embodiments have been described. Various alterations, modifications, and improvements will readily occur to those skilled in the art. In particular, the above-described two-phase charge-coupled device 100 may be used otherwise than as an image sensor, for example, as a bidirectional shift register.

The conductivity types described hereabove in relation with FIGS. 4 to 17 may all be inverted, the levels of the control signals being then adapted by those skilled in the art, so that the charges stored and transferred are holes rather than electrons.

The different previously-indicated materials may be modified by those skilled in the art. Insulating layer 17 may be made of an assembly comprising a plurality of stacked insulating layers, for example, silicon nitride and silicon oxide layers, and layer 117 may thus be made of different insulating materials according to whether it forms part of an electrode 123, an electrode 125, or an insulating conductive wall 126. Substrate 101, or at least portions of substrate 101, may be made of semiconductor materials other than silicon, for example, of germanium or of silicon-germanium.

Further, although an example of device 100 where each pixel Pix comprises, between two successive walls 126, the electrodes 125 of three successive columns 131 alternated with the electrodes 123 of two successive columns 129, has been described in relation with FIG. 4, it will be within the abilities of those skilled in the art to adapt the number of columns 131 and/or 129. Similarly, it will be within the abilities of those skilled in the art to modify the number of rows 127 of electrodes 123, 125 between each two successive walls 126, as soon as there are at least two rows 127, preferably at least three rows 127.

Further, it will be within the abilities of those skilled in the art to adapt device 100 to the case where, between two successive walls 126, each pixel Pix comprises a number of electrodes 123 and 125 different from the number of electrodes 123 and 125 of each pixel Pix between two other successive walls, and/or in the case where the electrodes 125 of a same column are only aligned between each two successive walls 126.

Various embodiments with different variations have been described hereabove. It should be noted that those skilled in the art may combine various elements of these various embodiments and variations without showing any inventive step.

Finally, the practical implementation of the described embodiments and variations is within the abilities of those skilled in the art based on the functional indications given hereabove.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A charge-coupled device, comprising:
   an array of insulated electrodes vertically penetrating into a semiconductor substrate, the array comprising rows of alternated longitudinal and transverse electrodes, each end of a longitudinal electrode of a row being opposite and separated from a portion of an adjacent transverse electrode of said row; and
   electric insulation walls extending parallel to one another and parallel to the longitudinal electrodes, the electric insulation walls penetrating vertically into the semiconductor substrate deeper than the longitudinal electrodes; and wherein at least two adjacent rows of alternated longitudinal and transverse electrodes are arranged between each two successive electric insulation walls.

2. The device according to claim 1, wherein the insulated electrodes of the array form columns of longitudinal electrodes alternated with columns of transverse electrodes, said columns being orthogonal to the rows.

3. The device according to claim 2, wherein the transverse electrodes of the column are aligned in each column of transverse electrodes, and wherein the longitudinal electrodes of the column are parallel to one another in each column of longitudinal electrodes.

4. The device according to claim 2, wherein, between each two successive electric insulation walls, the insulated electrodes of said at least two rows belonging to a same column are electrically coupled together.

5. The device according to claim 4, wherein:
during a charge transfer in a transfer direction, each longitudinal electrode of each row is electrically coupled to the adjacent transverse electrode of said row which is arranged upstream of said longitudinal electrode with respect to the transfer direction; and
further comprising means for applying, in a row of insulated electrodes, a first shift signal to one longitudinal electrode out of two, and for applying a second shift signal to the other longitudinal electrodes.

6. The device according to claim 5, wherein:
during a first phase of the transfer, the first signal is in a high state and the second signal is in a low state; and
during a second phase of the transfer, the first signal is switched to the low state and the second signal is switched to the high state.

7. The device according to claim 5, wherein:
during a first phase of the transfer, the first and second signals are in the low state during a portion of the first phase, and the first signal is set to the high state during another portion of the first phase; and
during a second phase of the transfer, the first and second signals are in the low state during a portion of the second phase, and the second signal is set to the high state during another portion of the second phase.

8. The device according to claim 5, wherein the signal received by each transverse electrode is phase leading over the signal received by the longitudinal electrode to which the transverse electrode is electrically coupled.

9. The device according to claim 2, wherein two successive electric insulation walls laterally delimit pixels of a row of pixels.

10. The device according to claim 9, comprising a plurality of rows of pixels.

11. The device according to claim 2, wherein two columns of transverse electrodes separated from each other by at least one column of transverse electrodes laterally delimit pixels of a same column of pixels.

12. The device according to claim 11, comprising a plurality of columns of pixels.

13. The device according to claim 11, wherein the transverse electrodes laterally delimiting pixels penetrate into the semiconductor substrate down to a same depth as said electric insulation walls.

14. The device according to claim 1, wherein the semiconductor substrate is doped with a first conductivity type, and comprises, between each two successive electric insulation walls, a doped well of a second conductivity type penetrating less deeply into the semiconductor substrate than the longitudinal electrodes.

15. The device according to claim 14, wherein, between each two successive electric insulation walls:
the doped well extends widthwise at least from the longitudinal electrodes of that row of said at least two rows which is closest to a first one of the two successive electric insulation walls to at least the longitudinal electrodes of that row of said at least two rows which is the closest to a second one of the two successive electric insulation walls; and
the doped well further extends lengthwise at least along the entire length of said at least two rows.

16. The device according to claim 14, wherein the semiconductor substrate comprises a doped layer of the first conductivity type covering each doped well of the second conductivity type.

17. The device according to claim 16, wherein said doped layer is more heavily doped with the first conductivity type than the semiconductor substrate.

18. The device according to claim 16, wherein said doped layer of the first conductivity type extends, between each two successive electric insulation walls, from one to the other of said two successive electric insulation walls and from one end to another of each of said two successive electric insulation walls.

19. The device according to claim 1, wherein said electric insulation walls are insulated conductive walls.

20. The device according to claim 1, further comprising an interconnection structure resting on a front surface of the semiconductor substrate from which the insulated electrodes and the electric insulation walls penetrate into the semiconductor substrate.

21. The device according to claim 20, forming a sensor being configured to receive light on the front surface side of the semiconductor substrate.

22. The device according to claim 20, forming a sensor being configured to receive light on a back side of the semiconductor substrate opposite to the front surface.

* * * * *